(12) United States Patent  (10) Patent No.: US 9,257,524 B2
Maekawa et al.  (45) Date of Patent: Feb. 9, 2016

(54) LAYERED FILM INCLUDING HETEROEPITAXIAL PN JUNCTION OXIDE THIN FILM

(71) Applicant: TDK CORPORATION, Tokyo (JP)

(72) Inventors: Kazuya Maekawa, Tokyo (JP); Kunihiro Ueda, Tokyo (JP)

(73) Assignee: TDK CORPORATION, Tokyo (JP)

( * ) Notice: Subject to any disclaimer, the term of this patent is extended or adjusted under 35 U.S.C. 154(b) by 53 days.

(21) Appl. No.: 13/790,398

(22) Filed: Mar. 8, 2013

(65) Prior Publication Data

US 2013/0240874 A1   Sep. 19, 2013

(30) Foreign Application Priority Data

Mar. 14, 2012   (JP) .................................. 2012-057190

(51) Int. Cl.
  *H01L 29/66* (2006.01)
  *H01L 21/02* (2006.01)
  *H01L 29/861* (2006.01)
  *H01L 29/12* (2006.01)

(52) U.S. Cl.
  CPC .... *H01L 29/66136* (2013.01); *H01L 21/02381* (2013.01); *H01L 21/02483* (2013.01); *H01L 21/02488* (2013.01); *H01L 21/02491* (2013.01); *H01L 21/02505* (2013.01); *H01L 21/02565* (2013.01); *H01L 21/02576* (2013.01); *H01L 21/02579* (2013.01); *H01L 21/02581* (2013.01); *H01L 21/02631* (2013.01); *H01L 29/12* (2013.01); *H01L 29/861* (2013.01)

(58) Field of Classification Search
  CPC ........... H01L 29/861; H01L 21/02472; H01L 45/147; H01L 29/66136; H01L 21/02483; H01L 21/02505; H01L 29/12; H01L 21/02581; H01L 21/02491; H01L 21/02576
  USPC .......................................................... 257/43
  See application file for complete search history.

(56) References Cited

U.S. PATENT DOCUMENTS 5,810,923 A * 9/1998 Yano et al. ...................... 117/84
(Continued)

FOREIGN PATENT DOCUMENTS

JP    2004119525 A * 4/2004
JP    A-2004-119525   4/2004
JP    2008034641 A * 2/2008

OTHER PUBLICATIONS

Putkonen, et al., "Deposition of yttria-stabilized zirconia thin films by atomic layer epitaxy from B-diketonate and organometallic precursors", J. Mater. Chem., 2002, 12, 442-448.*

(Continued)

*Primary Examiner* — Matthew Reames
*Assistant Examiner* — Vincent Wall
(74) *Attorney, Agent, or Firm* — Oliff PLC

(57) ABSTRACT

Semiconductors of different types are formed by a crystal growth technique and joined at the interface at which rapid atomic-layer-level compositional changes occur while maintaining high crystallinity of the semiconductor layers so as to form a heterogeneous PN junction. A layered film that includes a PN junction oxide thin film is formed on a single crystal substrate. The PN junction oxide thin film is constituted by an N-type semiconductor oxide thin film and a P-type semiconductor oxide thin film that are epitaxially grown to have c-axis orientation represented by (00k).

9 Claims, 7 Drawing Sheets

(56) References Cited

U.S. PATENT DOCUMENTS

| | | | |
|---|---|---|---|
| 6,614,178 B1 * | 9/2003 | Okada | 313/509 |
| 2011/0149634 A1 * | 6/2011 | Schloss et al. | 365/148 |
| 2012/0175581 A1 * | 7/2012 | Hwang | 257/2 |

OTHER PUBLICATIONS

Ginestra et al., "Atomic Layer Deposition of Y2O3/ZrO3 Nanolaminates: a route to ultrathin solid-state electrolyte membranes", Electrochemical and Solid-State Letters, 10 (10) B161-B165 (2007).*

* cited by examiner

SOLID LINE: ——
c-AXIS ORIENTED EPITAXIAL
FILM FOR BOTH P-TYPE
AND N-TYPE

BROKEN LINE: ---
AMORPHOUS FILM FOR
BOTH P-TYPE AND N-TYPE

SOLID LINE: ——
c-AXIS ORIENTED EPITAXIAL
FILM FOR BOTH P-TYPE
AND N-TYPE

SOLID LINE: ——
c-AXIS ORIENTED EPITAXIAL FILM FOR BOTH P-TYPE AND N-TYPE

BROKEN LINE: ---
AMORPHOUS FILM FOR BOTH P-TYPE AND N-TYPE

LAYERED FILM INCLUDING HETEROEPITAXIAL PN JUNCTION OXIDE THIN FILM

BACKGROUND OF THE INVENTION

1. Field of the Invention

The present invention relates to a layered film including a heteroepitaxial PN junction oxide thin film.

2. Description of the Related Art

PN junctions formed by elemental semiconductors such as Si and Ge and compound semiconductors such as GaAs, InP, and GaN are widely used in solid-state electronic devices such as bipolar transistors and rectifier diode devices and solid-state photoelectronic devices such as semiconductor lasers, light-emitting diodes, photodetectors, and solar cells. Homogeneous PN junctions composed of the same types of compounds are often used in these devices. However, in semiconductor lasers and light-emitting diodes, heterogeneous PN junctions composed of compounds of different types are used.

In order to ensure optimum device characteristics and reproducibility thereof for these electronic devices, the crystallinity of functional films is desirably high. It is difficult to obtain favorable device characteristics from polycrystalline substances due to disturbance of physical quantities at grain boundaries. Accordingly, epitaxial films as close to single crystals as possible are needed.

However, as in the case of making heterogeneous PN junctions, it is difficult with a crystal growth technique to join semiconductors of different types at the interface at which rapid atomic-layer-level compositional changes occur and to conduct deposition while maintaining high crystallinity of the semiconductor layers. Furthermore, materials used for forming PN junctions, in particular, compound semiconductor materials, are in many cases thermally and chemically unstable, hazardous to environment, and facing depletion of resources. Some of the challenges imposed on PN junction devices that use semiconductor materials can be addressed by using oxide semiconductor materials.

However, it is still difficult to form semiconductor thin films with oxides, in particular, to form a P-type semiconductor with an oxide. Japanese Unexamined Patent Application Publication No. 2004-119525 discloses a PN junction device and reports that a PN junction having a heteroepitaxial interface is realized by depositing a polycrystal P-type oxide film on an epitaxially grown N-type semiconductor oxide thin film and then annealing the two films. However, annealing a film deposited to be in a polycrystal state will only improve the crystallinity of each of the domains constituting the polycrystal state and will not give an epitaxial film that is close to single crystal. There has been no report of forming a heteroepitaxial PN junction with oxide semiconductor thin films.

In order to achieve good PN junction device characteristics from oxide semiconductors, epitaxial films that are close to single crystal as much as possible are needed. In particular, in order to stack materials of different types as in forming a heteroepitaxial PN junction, materials having different lattice constants must be stacked while maintaining the crystallinity. Accordingly, there is a high expectation for development of a technique for c-axis-oriented epitaxial growth of oxide semiconductors.

SUMMARY OF THE INVENTION

As in the case of making a heterogeneous PN junction, it is difficult with a crystal growth technique to join semiconductor of different types at the interface at which rapid atomic-layer-level compositional changes occur and to conduct deposition while maintaining high crystallinity of the semiconductor layers. Furthermore, materials used for forming PN junctions, in particular, compound semiconductor materials, are in many cases thermally and chemically unstable, hazardous to environment, and facing depletion of resources.

To address these challenges, the crystallinity of a semiconductor functional layered film having a heterogeneous PN junction is improved and films constituting the layered film are each grown to have an orientation parallel or normal to the crystal orientation of the crystals of the substrate material. As a result, a functional layered film that has good crystallinity and have an in-plane surface orientation matching that of the substrate can be provided.

An aspect of the present invention provides a layered film formed on a single crystal substrate, the layered film including a heteroepitaxial PN junction oxide thin film including an N-type semiconductor oxide thin film and a P-type semiconductor oxide thin film that are each epitaxially grown to have c-axis orientation represented by (00k).

The layered film preferably further includes an epitaxially grown buffer layer containing $ZrO_2$ and $Y_2O_3$ and serving as an underlayer for the heteroepitaxial PN junction oxide thin film; and an epitaxially grown metal thin film disposed between the heteroepitaxial PN junction oxide thin film and the buffer layer, the metal thin film containing at least one element selected from the group consisting of Pt, Ir, Pd, Ru, and Rh.

Preferably, the N-type semiconductor oxide thin film is composed of a doped perovskite-type compound represented by $R(M_x,D_y)O_3$ or $(R_x,D_y)MO_3$ obtained by doping a perovskite-type compound represented by general formula $RMO_3$ with a metal D other than R and M, and the amount of the metal D is adjusted to x+y=1 and 0.03≤y≤0.3 to control epitaxial growth of the P-type semiconductor oxide thin film on the N-type semiconductor oxide thin film so that the P-type semiconductor oxide thin film has c-axis orientation represented by (00k).

In the doped perovskite-type compound represented by $R(M_x,D_y)O_3$ or $(R_x,D_y)MO_3$, R is preferably selected from the group consisting of Ba, Ca, Fe, K, La, Li, Mg, Mn, Na, Sr, and Zn, M is preferably selected from the group consisting of Co, Fe, Hf, La, Mn, Nb, Ni, Si, Sn, Ta, Ti, and Zr, and D is preferably selected from the group consisting of Al, Ba, Ca, Ce, Co, Cr, Fe, Hf, K, La, Mg, Mn, Na, Nb, NiSr, V, Y, Zn, and Zr.

Preferably, the P-type semiconductor oxide thin film is composed of a material selected from the group consisting of SnO, NiO, and $Cu_2O$.

Preferably, when an oriented surface of a stack constituted by the N-type semiconductor oxide thin film and the P-type semiconductor oxide thin film is subjected to x-ray diffraction, the highest intensity of a reflection peak of a plane other than a c-axis-oriented plane represented by (00k) is 10% or less of the intensity of a reflection peak of the c-axis-oriented plane.

Preferably, when the N-type semiconductor oxide thin film and the P-type semiconductor oxide thin film are analyzed by x-ray diffraction through rocking curve scan of a c-axis-oriented plane represented by (00k), at least one of the N-type semiconductor oxide thin film and the P-type semiconductor oxide thin film exhibits a full-width half-maximum of 0.8° or less Preferably, the differences in rotation angle between the in-plane surface orientation of the single crystal substrate and the in-plane surface orientation of the N-type semiconductor oxide thin film and between the in-plane surface orientation of the single crystal substrate and the in-plane surface orientation of the P-type semiconductor oxide thin film are 1° or less.

Preferably, the single crystal substrate is composed of a material selected from the group consisting of Si, MgO, $SrTiO_3$, and $LiNbO_3$.

It is difficult to form different types of semiconductors formed by crystal growth and join them at an interface at which rapid atomic-layer-level compositional changes occur while maintaining high crystallinity of the semiconductor layers, as in making a heterogeneous PN junction. However, according to the present invention, a functional layered film can be formed from chemically and thermally stable materials that are harmless to the environment and exist in abundance, the crystallinity of the semiconductor functional layered film having a heterogeneous PN junction can be improved, and the semiconductor functional layered film can be grown to have crystal orientation parallel or normal to the crystal orientation of the crystals of the substrate material. As a result, a functional layered film that has high crystallinity and in-plane surface orientation matching with that of the substrate can be provided.

DESCRIPTION OF THE PREFERRED EMBODIMENTS

Preferred embodiments of the present invention will now be described with reference to the attached drawings. It should be understood that the embodiments described below in no way limit the scope of the present invention and the constitutional elements described below may naturally encompass those easily conceivable by skilled persons and those which are substantially the same. The constitutional elements described below can also be freely combined if needed.

Figure 1:
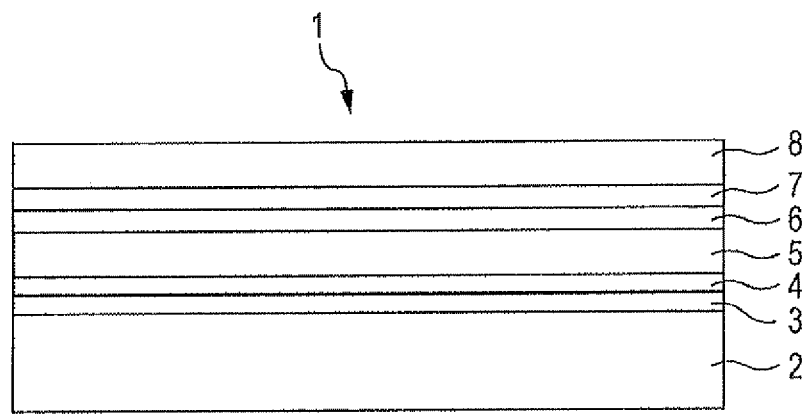
FIG. 1 is a schematic view of layers epitaxially grown on a single-crystal substrate according to Examples.

Referring to FIG. 1, a layered film 1 according to an embodiment of the present invention is formed on a single crystal substrate 2 composed of Si single crystals or the like. The layered film 1 includes a buffer layer constituted by buffer sublayers 3 and 4 on the substrate side, a lower metal thin film 5 in contact with the buffer sublayer 4, an N-type semiconductor oxide thin film 6 and a P-type semiconductor oxide thin film 7 each constituted by one or more layers, and an upper metal thin film 8 in contact with the P-type semiconductor oxide thin film 7. The buffer sublayers 3 and 4, the lower metal thin film 5, the N-type semiconductor oxide thin film 6 and P-type semiconductor oxide thin film 7, and the upper metal thin film 8 may be made by any method capable of forming epitaxial films on a single crystal substrate 2, in particular, a Si single crystal substrate.

This embodiment will now be described with reference to drawings. FIG. 1 is a diagram illustrating a structure of the layered film 1 that includes a heteroepitaxial PN junction oxide thin film according to this embodiment.

Substrate 2

The substrate 2 used in this embodiment is preferably composed of a material selected from Si, MgO, $SrTiO_3$, and $LiNbO_3$ in order to accelerate c-axis-oriented epitaxial growth. In order to improve the c-axis crystallinity, a substrate having a Si(100) single crystal surface is most preferable. When a Si single crystal substrate is used, the substrate and the layered film thereon will have in-plane axes parallel to each other. The shape and thickness of the substrate and the amount of dopant in the substrate are not particularly limited.

Buffer Layer

A buffer layer is provided between the lower metal thin film 5 and the substrate 2. The buffer layer also functions as an insulator.

The composition of the buffer layer can be expressed by $Zr_{(1-x)}K_xO_2$ where K represents a rare earth element or an alkaline earth element. For example, K may represent a rare earth metal element such as Sc and Y and x=0 to 1.0. Zirconium oxide ($ZrO_2$) in which x=0 undergoes phase transitions from cubic to tetragonal to monoclinic from high temperature to room temperature; however, doping zirconium oxide with a rare earth element or an alkaline earth element will give a stable cubic crystal. An oxide obtained by doping $ZrO_2$ with a rare earth element or an alkaline earth element is usually called stabilized zirconia. In this embodiment, a rare earth element is preferably used for stabilizing $ZrO_2$.

The rare earth element in the stabilized zirconia thin film may be adequately selected by considering the lattice constants of the substrate and the adjacent thin film in contact with the stabilized zirconia thin film so that the lattice constant of the stabilized zirconia thin film matches those of the substrate and the adjacent thin film.

The rare earth element used in the buffer layer is preferably one selected from the group consisting of Sc, Y, Ce, Eu, Gd, Tb, Dy, Ho, Er, Tm, Yb, and Lu by taking into account the lattice constant of the resulting oxide and other conditions.

The buffer layer may be doped with an additive to improve the characteristics. For example, Al and Si have an effect of improving the resistivity of the film. Transition metal elements such as Mn, Fe, Co, and Ni can serve as an impurity that forms a level (trap level) in the film and the electrical conductivity can be controlled by utilizing this level.

The thickness of the buffer layer may be any, preferably 5 to 1000 nm, and more preferably 25 to 100 nm. The thickness of the buffer layer may be determined so that the underlayer is a homogeneous epitaxial film and the surface is flat and free of cracks. The buffer layer may be constituted by one or more sublayers composed of specified materials.

Method for Forming Buffer Layer

A specific example of a method for forming a buffer layer composed of stabilized zirconia will now be described.

In order to form a buffer layer, a physical vapor deposition (PVD) technique is employed. PVD is a physical gas-phase growth or physical vapor deposition technique of forming a thin film on a surface of a substance and a thin film of a desired substance can be deposited in a gas phase on a surface of a substance by a physical technique. For example, a resistive heating vapor deposition technique, an electron beam vapor deposition technique, a molecular beam epitaxy technique, an ion plating technique, an ion beam deposition technique, or a sputtering technique may be employed. An electron beam vapor deposition system is preferably used. The electron beam vapor deposition system includes an oxidizing gas supply unit, a Zr evaporation unit, and a rare earth element evaporation unit, and the partial pressure of the oxidizing gas is preferably adjusted to be higher near the substrate. Each evaporation unit needs an evaporation source and an energy supply device for supplying energy needed for evaporation. The energy supply device may be of an electron beam generating type or a resistive heating type.

The single crystal Si substrate is preferably surface-treated before forming a buffer layer. The surface treatment of the substrate is preferably RCA cleaning that includes washing with hydrofluoric acid. In other words, the substrate is preferably cleaned at high temperature with a high-concentration chemical solution that contains hydrogen peroxide as a base and an alkali or an acid.

After the surface treatment, the Si crystals on the substrate surface are coated and protected by a Si oxide layer. The Si oxide layer is reduced by the metal such as Zr supplied to the substrate surface during formation of the buffer layer and removed.

Next, the substrate is heated in vacuum and Zr, a rare earth element, and oxidizing gas are supplied to the substrate surface to form a buffer layer. The heating temperature may be adequately set to obtain desirable crystallinity. In particular, the heating temperature is preferably 800° C. or higher to achieve crystallization and a film with high crystallinity can be obtained when the heating temperature is 850° C. or higher. The oxidizing gas used may be oxygen, ozone, atomic oxygen, $NO_2$, radical oxygen, or the like. In the description below, oxygen is used as an example of the oxidizing gas.

In forming the buffer layer, the vacuum chamber is continuously evacuated with a vacuum pump while continuously supplying the oxygen gas into the vacuum deposition chamber. The oxygen partial pressure near the substrate is preferably about $5 \times 10^{-4}$ to 0.5 Torr. The amount of the oxygen gas supplied is preferably 2 to 60 cc/min and more preferably 4 to 30 cc/min. Since the optimum amount of supply of the oxygen gas is determined by the volume of the vacuum chamber, the evacuation rate of the pump, and other associated factors, the amount of the oxygen gas supplied is determined in advance.

The evaporation sources are heated with an electron beam or the like to form vapor and the vapor is supplied to the substrate. In order to form a homogeneous thin film, the deposition rate is preferably 0.002 to 1.00 nm/sec and more preferably 0.005 to 0.500 nm/sec.

A thin film composed of a rare earth element oxide and a thin film composed of zirconium oxide may also be formed in the same manner as the stabilized zirconia thin film. For example, in the case where a rare earth element oxide thin film is to be formed on a zirconium oxide thin film and the same rare earth element is used in both thin films, supply of Zr is stopped as soon as the zirconium oxide thin film reaches a particular thickness and only the rare earth element is continuously supplied thereafter so as to form the two thin films continuously. In order for the buffer layer to have a gradient composition, the amount of Zr supplied may be gradually decreased to zero and then a rare earth element oxide thin film may be formed.

Lower Metal Thin Film 5

When the layered film of this embodiment is used as a constitutional element of an electronic device, the lower metal thin film 5 mainly functions as an electrode. The method for forming the lower metal thin film 5 may be any PVD or chemical vapor deposition (CVD) technique that satisfies the deposition conditions such as deposition temperature and pressure that can form a single crystal film. Examples of the PVD technique include a resistive heating vapor deposition technique, an electron beam vapor deposition technique, a molecular beam epitaxy technique, an ion plating technique, an ion beam deposition technique, and a sputtering technique. Examples of the CVD technique include thermal CVD, light CVD, plasma CVD, epitaxial CVD, atomic layer CVD, and metal organic (MO)-CVD.

The lower metal thin film 5 preferably contains at least one element selected from the group consisting of Pt, Ir, Pd, Ru, and Rh and is preferably composed of a single metal selected from these or an alloy containing these metals. The lower metal thin film 5 may be constituted by two or more thin films having different compositions. The lower metal thin film 5 absorbs stresses in the thin film laminate and thereby prevents cracking of a thin film formed on the lower metal thin film 5.

The thickness of the lower metal thin film 5 differs depending on the usage but is preferably 10 to 500 nm and more preferably 50 to 200 nm. The lower metal thin film 5 is preferably thin without adversely affecting the crystallinity and the surface properties. The specific resistance of the lower metal thin film 5 is preferably $10^{-7}$ to $10^3$ $\Omega$cm and more preferably $10^{-7}$ to $10^{-2}$ $\Omega$cm.

Method for Forming Lower Metal Thin Film 5

The lower metal thin film 5 may be formed by any method as long as the deposition temperature and pressure that can produce a single crystal film are satisfied. Preferably, a vapor deposition technique and a sputtering technique are used in combination from the viewpoint of efficiency. The substrate temperature during the vapor deposition and sputtering is preferably 500 to 750° C. If the substrate temperature is excessively low, it is difficult to obtain a film having high crystallinity. If the substrate temperature is excessively high, the surface roughness of the film tends to be large.

In this embodiment, the flatness of the surface of the lower metal thin film 5 is improved by adjusting the thickness of the lower metal thin film 5. The ten-point mean roughness Rz in a 500 nm sample length at the metal thin film surface is 10 nm or less and preferably 2 nm or less. This surface roughness is preferably realized in 80% or more of the area of each layer. The surface roughness is a value determined by taking measurement at arbitrarily selected 10 or more points evenly distributed over a region having an area of 10 $cm^2$ or more for each layer formed over the entire surface of the substrate. In this description, Rz is said to be 2 nm or less in 80% or more of the thin film surface when 80% or more of the 10 or more points at which the measurement has been taken exhibit Rz of 2 nm or less. The surface roughness Rz is measured in accordance with Japanese Industrial Standard (JIS) B0610.

Platinum (Pt) grows as island crystals immediately after start of deposition of a metal thin film but eventually grows into a substantially continuous film once deposition is continued to a thickness of about 50 nm. If Pt is deposited at a higher deposition rate on a Pt surface that is yet form a continuous film, parts that are still in an island state and not yet forming a continuous film form pinholes and deposition continues without burying the pinholes. As a result, crystallinity and regularity are impaired and insufficient epitaxial growth results. Thus, the surface roughness of the Pt surface is degraded, the in-plane surface orientation of the Pt layer is rotated in-plane, and the difference in in-plane surface orientation widens between the substrate 2 and the metal thin film. Moreover, the crystallinity of a perovskite-type compound thin film that serves as an underlayer and is deposited on the lower metal thin film 5 will be degraded and the difference in the in-plane surface orientation between the substrate 2 and the layer on the lower metal thin film 5 will widen.

N-Type Semiconductor Oxide Thin Film 6

The N-type semiconductor oxide thin film 6 is provided between the lower metal thin film 5 and the P-type semiconductor oxide thin film 7. The N-type semiconductor oxide thin film 6 is preferably composed of a perovskite-type compound that has a lattice constant close to an intermediate value between the lattice constant of the crystals of the P-type semiconductor oxide thin film 7 thereon and the lattice constant of the crystals of the lower metal thin film 5 therebelow. A perovskite structure is expressed by general formula $RMO_3$, has a cubic unit lattice, and is constituted by metal R at the vertexes of the cubic crystal, metal M at the body center of the cubic crystal, and oxygen O at each face center of the cubic crystal. The orientation of $MO_6$ octahedrons constituted by oxygen and metal M is easily distorted by interaction with metal R and thus the phase transition into a monoclinic structure or a hexagonal structure having a lower symmetry occurs, thereby changing the characteristics.

The phase transition induced by distortion can be controlled by introducing impurity atoms to the metal R sites and the metal. M sites. The properties of the material can be made semiconductive by introducing an impurity element that has a valence different from the metal R and the metal M. If an N-type semiconductor is desirable, atoms of an impurity element that has a higher valence than the original metal R and the original metal M may be introduced into these sites.

The N-type semiconductor oxide thin film 6 is composed of a doped perovskite-type compounds represented by $R(M_x, D_y)O_3$ or $(R_x,D_y)MO_3$ obtained by doping a perovskite-type compound represented by general formula $RMO_3$ with a metal D other than R and M, where R may be selected from Ba, Ca, Fe, K, La, Li, Mg, Mn, Na, Sr, and Zn and M may be selected from Co, Fe, Hf, La, Mn, Nb, Ni, Si, Sn, Ta, Ti, and Zr. The metal R and M may each be selected from the materials that can be used in the lower metal thin film 5 and perovskite materials that can be formed on Pt, Ir, Pd, Ru, and Rh.

The dopant metal D may be selected from Al, Ba, Ca, Ce, Co, Cr, Fe, Hf, K, La, Mg, Mn, Na, Nb, Ni, Sn, Sr, V, Y, Zn, and Zr. The metal D used as a dopant for the N-type semiconductor oxide thin film 6 has been confirmed to promote epitaxial growth of the P-type semiconductor oxide thin film 7 thereon when the metal D is an element that has a higher valence and a larger ionic radius than R and M constituting $RMO_3$ to be replaced by D. It has also been confirmed that when the amount of the dopant metal D is adjusted to x+y=1 where $0.03 \leq y \leq 0.3$ and preferably $0.05 \leq y \leq 0.25$ as shown in Table 1, the orientation of the crystals of the P-type semiconductor oxide thin film 7 grown on the N-type semiconductor oxide thin film 6 can be controlled to (00k), which indicates c-axis oriented epitaxial growth.

TABLE 1

| Amount of N-type dopant Atomic % | Peak intensity ratio of reflection maximum peak to a peak other than the reflection maximum peak in x-ray diffraction on oriented surface of stack constituted by N-type film and semiconductor oxide film that form PN junction | Peak intensity ratio of reflection maximum peak to a peak other than the reflection maximum peak in x-ray diffraction on oriented surface of stack constituted by P-type film and semiconductor oxide film that form PN junction |
|---|---|---|
| 0.00 | 3.98 | 24.36 |
| 0.50 | 3.33 | 19.65 |
| 1.02 | 2.97 | 10.78 |
| 3.02 | 1.96 | 4.98 |
| 4.76 | 1.45 | 3.56 |
| 5.02 | 0.88 | 0.98 |
| 10.02 | 0.58 | 0.88 |
| 14.98 | 0.48 | 0.56 |
| 20.03 | 0.19 | 0.43 |
| 24.98 | 0.32 | 0.98 |
| 29.98 | 3.98 | 9.80 |
| 35.08 | 4.66 | 13.45 |
| 45.04 | 4.98 | No crystal growth |

Method for Forming N-Type Semiconductor Oxide Thin Film 6

The N-type semiconductor oxide thin film 6 is preferably formed by any of various PVD techniques but may be formed by CVD or the like. An example of the PVD technique is a parallel plate RF magnetron sputtering technique. During deposition, the potential of the substrate stage is preferably adjusted to avoid plasma damage. The substrate temperature during sputtering is preferably 400° C. to 750° C. At an excessively low substrate temperature, it is difficult to obtain a film with high crystallinity. At an excessively high substrate temperature, the surface of an epitaxial film exhibits large roughness although an epitaxial film can be formed, and it becomes difficult to have the in-plane surface orientation of the P-type semiconductor oxide thin film 7 thereon to match with the surface orientation of the single crystal substrate 2.

Examples of the plasma-generating gas include Ar, $Ar+O_2$, Xe, $Xe+O_2$, Kr, $Kr+O_2$, $N_2$, $N_2+O_2$, and $NO_2$. The $O_2$ partial pressure of the plasma-generating gas is preferably about 2% to 50% relative to the main component gas. The properties of the functional film layer or the N-type semiconductor oxide thin film 6 directly affects the characteristics of the resulting device. Because of the physical properties of the P-type semiconductor oxide thin film 7, the characteristics thereof are largely dependent on the crystal structure as the P-type semiconductor oxide thin film 7, transitions in characteristics due to linear expansion coefficient, and film stresses. The N-type semiconductor oxide thin film 6 also has a role of relaxing stresses caused by the difference in lattice constant between the lower metal thin film 5 and the P-type semiconductor oxide thin film 7 and the linear expansion coefficient. The physical property values, deposition temperature, deposition rate, target-to-substrate distance, deposition pressure, and oxygen partial pressure can be adjusted to finely tune the characteristics of the device.

There are many ferroelectric and ferromagnetic perovskite-type compounds that have a curie point. When such materials are epitaxially formed into thin films, deposition is in many cases conducted at a deposition temperature equal to or higher than the curie point. In such a case, the temperature should not be immediately decreased to room temperature and the temperatures of the substrate and the layered film may be maintained to a phase transition temperature for about 1 min to 300 min so as to improve the characteristics and stresses of the layered film and the surface roughness and the like of the P-type semiconductor oxide thin film 7. It is known that in many P-type semiconductor oxide thin films composed of materials having a curie point, a-domains oriented in the in-plane direction and c-domains oriented in a normal direction at a phase transition temperature undergo dislocation and inversion. However, such behavior of the domains can be moderated by maintaining the phase transition temperature.

In order to adjust the difference in rotation angle between the in-plane surface orientation of the single crystal substrate 2 of this embodiment and the in-plane surface orientation of the perovskite-type compound to 1° or less, the in-plane rotation angle of each domains, such as a-domains and c-domains, constituting the perovskite-type compound is preferably 1° or less for every layer. Alternatively, the absolute value of the difference in maximum value between the clockwise (CW) rotation angle and counterclockwise (CCW) rotation angle in the plane of each domain is preferably 1° or less.

P-Type Semiconductor Oxide Thin Film 7

The P-type semiconductor oxide thin film 7 is deposited on the N-type semiconductor oxide thin film 6 and forms a heteroepitaxial PN junction oxide thin film. The heteroepitaxial PN junction oxide thin film has various properties of a functional layered film and is an essential film that determines the device characteristics of a device that uses the heteroepitaxial PN junction oxide thin film. In Examples related to this embodiment, SnO, NiO, and $Cu_2O$ are used to grow the P-type semiconductor oxide thin film 7. In Examples, SnO, NiO, and $Cu_2O$ each have a face-centered cubic lattice structure are used to form P-type semiconductor oxide thin films 7 having a band gap of about 2.0 V to 4.0 V. In Examples, a heteroepitaxial PN junction oxide layered film is formed by epitaxially growing a c-axis-oriented P-type semiconductor oxide thin film 7 on a c-axis-oriented N-type semiconductor oxide thin film 6 epitaxially grown. The results of experiments on materials for P-type semiconductor metal oxide thin films having different lattice constants confirm that materials having face-centered cubic structures can be used to form the P-type semiconductor oxide thin film 7.

P-type semiconductors are semiconductors that use holes as carriers for transporting charges. Electrical current is generated as holes having positive charges migrate. For example, a P-type semiconductor is obtained by doping a tetravalent intrinsic semiconductor such as silicon with a trace amount of a trivalent impurity (boron, aluminum, or the like). SnO, NiO, and $Cu_2O$ used here are P-type semiconductor oxides in which holes serve as carriers. Of these, only NiO is doped with Li. This is because doping NiO with Li results in substitution of the Ni sites with Li atoms and the electrical conductivity can be significantly increased.

As shown in Table 3, a reliability test was performed on the single crystal substrate 2 and a heteroepitaxial PN junction oxide thin film epitaxially grown thereon so as to evaluate the characteristics reproducibility. It was confirmed that incidence of the separation of the perovskite-type compound thin film from the substrate can be reduced when the difference in rotation angle between the in-plane surface orientation of the single crystal substrate 2 and the in-plane surface orientation of the P-type semiconductor oxide thin film 7 was 1° or less.

Method for Forming P-Type Semiconductor Oxide Thin Film 7

The P-type semiconductor oxide thin film 7 is preferably formed by any of various PVD techniques but may be formed by a CVD technique. An example of the PVD technique is a parallel plate RF magnetron sputtering technique. During deposition, the potential of the substrate stage is preferably adjusted to avoid plasma damage. The substrate temperature during sputtering is preferably 400° C. to 900° C. At an excessively low substrate temperature, it is difficult to obtain a film having high crystallinity. At an excessively high substrate temperature, the surface roughness of the film tends to increase.

Examples of the plasma-generating gas that can be used include Ar, $Ar+O_2$, Xe, $Xe+O_2$, Kr, $Kr+O_2$, $N_2$, $N_2+O_2$, and $NO_2$. The $O_2$ partial pressure of the plasma-generating gas is preferably about 2% to 50% relative to the main component gas. The P-type semiconductor oxide thin film 7 relaxes stresses caused by the difference in lattice constant between the lower metal thin film 5 and the P-type semiconductor oxide thin film 7 and the linear expansion coefficient. The stress relaxation can be adjusted through controlling the deposition temperature, deposition rate, target-to-substrate distance, deposition pressure, and oxygen partial pressure.

Method for Forming Upper Metal Thin Film 8

The upper metal thin film 8 may be formed as with the lower metal thin film 5 and exhibits the same effects as the lower metal thin film 5. If the upper metal thin film 8 is to be used as an electrode only, the upper metal thin film 8 may be formed by room temperature deposition through PVD or CVD.

Crystallinity and Surface Properties

The crystallinity of each of the P-type semiconductor oxide thin film 7, the N-type semiconductor oxide thin film 6, the upper metal thin film 8, the lower metal thin film 5, and the buffer layer can be evaluated through a full-width half-maximum of a rocking curve of a reflection peak in x-ray diffraction (XRD) or a pattern of a reflection high-energy electron diffraction image. The surface properties can be evaluated through an atomic force microscope or a scanning electron microscope.

In particular, each thin film preferably has a crystallinity at which the full-width half-maximum of a reflection rocking curve of a (200) plane or a (002) plane (Note: (400) plane for a rare earth c-type buffer layer) is 1.50° or less in XRD. There is no lower limit for the full-width half-maximum of a rocking curve and the full-width half-maximum is preferably as small as possible. Presently, the lower limit is generally about 0.7° and specifically about 0.4°. Thus, in the present invention, the threshold of the crystallinity in terms of the full-width half-maximum of the rocking curve is set to 0.8° since this value is about a half of 1.5° and is close to the general lower limit of the full-width half-maximum, which is about 0.7°. In a reflection high-energy electron beam diffraction image, spots in the image indicate that the surface is rough and streaks indicate that the surface is smooth and flat. In either cas, high sharpness of a reflection high-energy electron beam diffraction image indicates high crystallinity.

The buffer layer, the upper metal thin film 8, the lower metal thin film 5, the N-type semiconductor oxide thin film 6, and the P-type semiconductor oxide thin film 7 of the layered film of this embodiment are all epitaxial films. A first requirement of the epitaxial film as described in this specification is that it needs to be a single-orientation film. A single-orientation film here means that when subjected to XRD, the reflection peak intensities of the planes other than the target plane are 10% or less and preferably 5% or less of the maximum peak intensity of the target plane. For example, for a (k00) single-orientation film or a purely-c-plane-oriented film, the intensities of reflection of the planes other than the (k00) plane in $2\theta\text{-}\theta$ x-ray diffraction is 10% or less and preferably 5% or less of the maximum peak intensity of the (k00) plane reflection.

In this specification, (k00) denotes a set of equivalent planes such as (100) and (200). A second requirement of the epitaxial film as described in this specification is that, assuming that an x-y plane lies in-plane and the z-axis extends in the film thickness direction, the crystals are uniformly oriented in all of the x-axis, y-axis, and z-axis directions. Such orientation can be confirmed from a sharp spot or streak pattern obtained by reflection high-energy electron beam diffraction analysis. For example, when there is disturbance in crystal orientation in a buffer layer having a rough surface, the reflection high-energy electron beam diffraction image does not appear as sharp spots but tends to be stretched into a ring shape. A film that satisfies these two conditions is the epitaxial film.

In this embodiment, the difference between the in-plane surface orientation of the substrate 2 and the in-plane surface orientation of each deposited film is determined by in-plane x-ray diffraction measurement. The in-plane x-ray diffraction measurement measures diffracted beams resulting from in-plane diffraction while setting the x-ray incident angle to a grazing angle of about 0.2° to 0.5°, which is near the total reflection critical angle. Thus, a high resolution diffraction spectrum of in-plane lattice planes near the surface of the sample can be obtained.

In the in-plane measurement, the Bragg conditions are set with respect to the (004) plane of a single crystal substrate surface and the Φ axis which is the in-plane rotation axis is rotated 0° to 360°. As a result, four diffraction peaks of a cubic-structure single crystal substrate having a c-axis normal to the surface appear in a symmetrical manner. A reference angle $\theta_\chi$-φ between the x-ray optical axis and the diffraction plane is determined from a diffraction peak detection angle $\theta_\chi$ at which a diffraction peak can be observed and the Φ angle φ by which the sample-side in-plane rotation axis Φ is rotated in-plane until a diffraction is observed. The same $\theta_\chi$-φ measurement is conducted for the upper metal thin film 8, the lower metal thin film 5, the N-type semiconductor oxide thin film 6, and the P-type semiconductor oxide thin film 7 so as to calculate the difference in the in-plane surface orientation angle for each of these films with respect to the in-plane surface orientation angle of the single crystal substrate 2.

In measuring the in-plane surface orientation angle through in-plane x-ray diffraction, the full-width half-maximum of the x-ray intensity profile of the in-plane diffraction peak is preferably within 1°.

Industrial Applicability and Device Applications of Layered Film

According to this embodiment, a heteroepitaxial PN junction oxide thin film is epitaxially grown on a single crystal substrate. In XRD, the intensity of the peak other than the maximum peak of the oriented surface of the stack constituted by the N-type and P-type oxide films is 10% or less of the intensity of that maximum peak. Moreover, according to this embodiment, the difference in in-plane surface orientation between the functional film and the single crystal substrate 2 is within 1°. As a result, variations in physical properties and performance after deposition are reduced, and, compared to related art, properties and reproducibility of the properties of the P-type semiconductor oxide thin film 7 are improved, the stability of elastic modulus derived from the difference in in-plane surface orientation between stacked thin films is improved, and the reliability such as adhesion between the stacked thin films can be enhanced.

Table 2 shows a specific Improvement Example 1. A reliability test was performed on samples each including a stack of an N-type semiconductor oxide thin film 6 and a P-type semiconductor oxide thin film 7 forming the PN junction. In these samples, the ratio of the intensity of the peak other than the reflection peak of the oriented surface of the stack of the N-type and P-type semiconductor oxide thin films 6 and 7 forming a PN junction was varied with respect to the maximum peak intensity of that reflection peak of the oriented surface. In this test, each sample was subjected to a thermal shock test of exposing the sample to a −40° C. environment and then a +125° C. environment for 30 minutes each and conducting this cycle for 1000 cycles. The results in Table 2 confirm that the incidence of film separation decreased greatly as the ratio of the intensity of the peak other than the maximum reflection peak in x-ray diffraction reaches 10% or less. It was also revealed that the incidence of film separation became lower as the peak intensity ratio was decreased to 5% or less and to 1% or less, in other words, as the crystallinity was increased.

TABLE 2

| Peak intensity ratio of reflection maximum peak to peak other than reflection maximum peak in x-ray diffraction on a c-axis oriented surface of an N-type and P-type semiconductor oxide layered film Unit: % | Film separation incidence (%) |
| --- | --- |
| 63.000 | 33.000 |
| 23.000 | 15.000 |
| 9.870 | 3.000 |
| 4.880 | 1.300 |
| 1.120 | 1.000 |
| 0.980 | 0.300 |
| 0.550 | 0.001 |
| 0.490 | 0.000 |
| 0.190 | 0.000 |
| 0.089 | 0.000 |

Specific Improvement Example 2 is shown in Table 3. A reliability test was performed on samples in which the in-plane surface orientation of the AN junction oxide thin film was deviated with respect to a single crystal substrate surface. In the test, each sample was subjected to a thermal shock test of exposing the sample to a −40° C. environment and then a +125° C. environment for 30 minutes each and conducting this cycle for 1000 cycles. The results in Table 3 confirm that the incidence of film separation can be suppressed to 0.3% or less when the range of the difference in the in-plane surface orientation of the upper metal thin film 8, the lower metal thin film 5, the N-type semiconductor oxide thin film 6, and the P-type semiconductor oxide thin film 7 with respect to the in-plane orientation of the single crystal substrate 2 is 0.98° or less.

TABLE 3

| Range of difference in in-plane rotation angle at in-plane surface orientation of single crystal substrate, lower metal thin film, N-type semiconductor oxide film, and P-type semiconductor oxide film with respect to sing-e crystal substrate Unit: degrees | Film separation incidence (%) |
| --- | --- |
| 7.8 | 22.20 |
| 5.5 | 16.10 |
| 4.98 | 2.98 |
| 3.4 | 1.34 |
| 1.12 | 1.11 |
| 0.98 | 0.29 |

TABLE 3-continued

| Range of difference in in-plane rotation angle at in-plane surface orientation of single crystal substrate, lower metal thin film, N-type semiconductor oxide film, and P-type semiconductor oxide film with respect to sing-e crystal substrate Unit: degrees | Film separation incidence (%) |
| --- | --- |
| 0.097 | 0.01 |
| 0.029 | 0.00 |
| 0.018 | 0.00 |
| 0.0098 | 0.00 |

A heteroepitaxial PN junction oxide thin film on a single crystal substrate may be used in devices. In forming a functional device having a membrane structure or an oscillator structure, wet etching or dry etching is performed to shape the film. many single crystal materials have anisotropy to etchants and etchant gas and the shape formed by etching depends on the surface orientation of the substrate. This means that the shape to be formed by etching is naturally determined relative to the in-plane surface orientation of the single crystal substrate. In order to optimize the properties, the in-plane surface orientations of the functional film stacked on a single crystal substrate must be matched with that of the single crystal substrate before etching. The technique disclosed in this embodiment is suitable for devices that are formed through such a process.

Examples of the devices to which this embodiment can be applied include various materials such as superconductor films and thermoelectric films and devices that use these, a visible-light-reactive photocatalyst, a light emitter, a solid-phase electrolyte and an electrode of a lithium battery or the like, a solid-phase electrolyte of a fuel cell, a Josephson device, a superconductive transistor, a superconductive wiring LSI, a thermoelectric device, a silicon-on-insulator (SOI)-micro electro mechanical system (MEMS) device, a nonvolatile memory, an infrared sensor, an optical modulator, an optical switch, an optoelectronic integrated circuit, an LED, a thin-film diode, and a laser diode.

EXAMPLES

The present invention will now be described in more detail by using Examples.

Example 1

A layered film was formed on a Si(100) single crystal substrate by sequentially depositing a $ZrO_2$ thin film, an $Y_7O_3$ thin film, a Pt thin film, a $SrTi_{80}Nb_{20}O_3$ thin film, and a $Ni_{90}Li_{10}O$ thin film in that order through the following procedure.

First, a Si single crystal wafer (a disk-shaped wafer 3 inch in diameter and 400 μm in thickness) having a mirror-polished (100) surface was prepared. The surface of the wafer was cleaned by etching with a 40% aqueous ammonium fluoride solution.

The single crystal substrate was then fixed to a substrate holder equipped with rotating and heating mechanisms and installed in a vacuum chamber of a vapor deposition machine. The vacuum chamber was evacuated with an oil diffusion pump to $10^{-6}$ Torr. Upon completion of the evaluation, the substrate was rotated at 20 rpm and heated to 900° C. while introducing oxygen from near the substrate at 10 cc/min. In order to stabilize the substrate temperature, the substrate stabilization time of at least 5 minutes was taken after reaching the set temperature.

The substrate heated to 900° C. was rotated at 20 rpm. During this process, oxygen gas was supplied from a nozzle at 10 cc/min and vapor of metallic Zr was generated from an evaporation source and supplied to the substrate surface so as to reduce the Si oxide formed in the preceding step and form a thin film. The amount of metallic Zr fed was 10 nm in terms of the $ZrO_2$ film thickness. An x-ray diffraction diagram of this thin film had a clear (002) peak indicating $ZrO_2$ and was confirmed be a highly crystalline $ZrO_2$ film having purely (001) orientation. The $ZrO_2$ film exhibited a perfect streaky pattern in reflection high-energy electron diffraction and was confirmed to be a highly crystalline epitaxial film with a molecular-level flatness at the surface.

The single crystal substrate with the $ZrO_2$ thin film thereon was used as the substrate. Metallic Y was supplied to the substrate surface at a substrate temperature of 900° C., a substrate rotation rate of 20 rpm, and an oxygen gas introduction rate of 10 cc/min so as to form a $Y_2O_3$ thin film. The amount of metallic Y supplied was 40 nm in terms of the $Y_2O_3$ film thickness. A reflection high-energy electron beam diffraction image of this $Y_2O_3$ thin film showed sharp spots. This indicates that this $Y_2O_3$ thin film is a highly crystalline epitaxial layer with roughness on the surface.

Next, a Pt thin film 200 nm in thickness was formed on the $Y_2O_3$ thin film. The substrate temperature was 700° C. and the substrate rotation rate was 20 rpm. The full-width half-maximum of the rocking curve of the Pt(200) reflection of the Pt thin film was 0.21°, which indicates that this Pt thin film is an epitaxial film having high crystallinity.

Next, 50 nm of $SrTi_{80}Nb_{20}O_3$ was deposited on Pt. Deposition was performed by a parallel plate RF magnetron sputtering technique. The substrate temperature was set to 600 to 800° C. and deposition was conducted with Ar or Ar+$O_2$. In this example, the preferable $O_2$ partial pressure in the gas relative to Ar was about 5% to 25%.

Next, 50 nm of $Ni_{90}Li_{10}O$ was deposited on $SrTi_{80}Nb_{20}O_3$. Deposition was performed by a parallel plate RF magnetron sputtering technique. The substrate temperature was set to 400 to 900° C. and deposition was conducted with Ar or Ar+$O_2$. In this example, the preferable $O_2$ partial pressure in the gas relative to Ar was about 2% to 30%.

Figure 2:
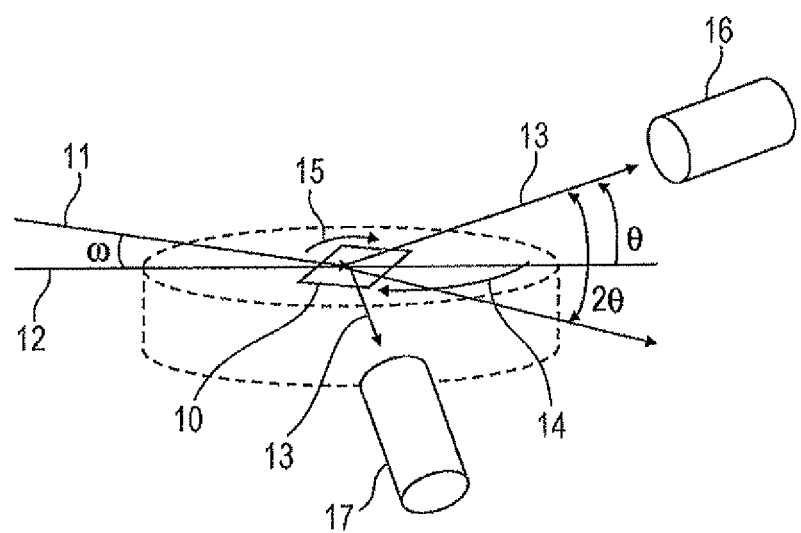
FIG. 2 is a diagram illustrating the principle of x-ray diffraction.
Figure 3:
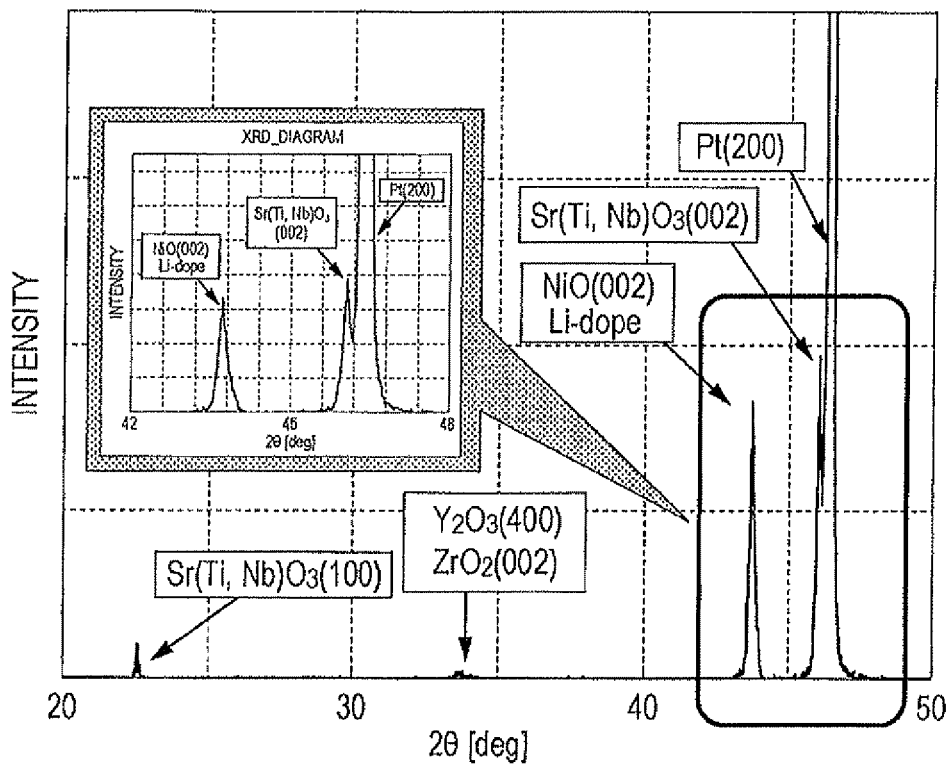
FIG. 3 is an x-ray diffraction chart of a Li-doped NiO/Nb-doped $SrTiO_3$/Pt/$Y_2O_3$/$ZrO_2$/Si(100) layered structure.

The $Ni_{90}Li_{10}O$ (100)/$SrTi_{80}Nb_{20}O_3$(100)/Pt(100)/$Y_2O_3$(100)/$ZrO_2$(100)/Si(100) layered film obtained as a result was subjected to a θ/2θ x-ray diffraction measurement with an x-ray diffractometer shown in FIG. 2. In FIG. 2, reference numeral 10 denotes a layered film sample on a single crystal substrate, 11 denotes an incident x-ray, 12 denotes an in-plane rotation axis, 13 denotes a diffracted x-ray, 14 denotes a diffraction peak detection angle $θ_x$, 15 denotes an angle φ by which the in-plane rotation axis 12 is rotated in-plane, 16 denotes an out-of-plane detector, and 17 denotes an in-plane detector. The x-ray diffraction data of the layered film is shown in FIG. 3 and Table 4. In FIG. 3, only the peaks attributable to planes equivalent to the (100) plane and planes equivalent to the (001) plane are observed. This indicates that each thin film has purely (100) orientation or purely (001) orientation. Referring to Table 4, the main peak of the heterogeneous PN junction epitaxial oxide film was assumed to be the (002) peak of the c-axis oriented surface which exhibits the maximum peak intensity and the peak of the (110) plane was assumed to be the maximum intensity peak other than the (002) peak. Then the peak intensity ratio of (110) peak to the (002) peak was calculated. As shown in Table 4, the ratio was 0.26% for the P-type semiconductor oxide thin film, $Ni_{90}Li_{10}O$ and the ratio was 0.43% for the N-type semiconductor oxide thin film, $SrTi_{80}Nb_{20}O_3$.

TABLE 4

| NiO data | | | | Sr(Ti,Nb)O$_3$ data | | | | | Pt data |
|---|---|---|---|---|---|---|---|---|---|
| Li-doped NiO (0, 0, 2) | | Li-doped NiO (1, 1, 0) | | Intensity ratio (1, 1, 0)/ (0, 0, 2) % | Sr(Ti,Nb)O$_3$ (0, 0, 2) | | Sr(Ti,Nb)O$_3$ (1, 1, 0) | | Intensity ratio (1, 1, 0)/ (0, 0, 2) % | Pt 2θ (deg) |
| 2θ (deg) | Intensity (counts) | 2θ (deg) | Intensity (counts) | | 2θ (deg) | Intensity (counts) | 2θ (deg) | Intensity (counts) | | |
| 43.72 | 662.2 | 31.43 | 1.7 | 0.26 | 46.06 | 772.90 | 32.22 | 3.3 | 0.43 | 46.40 |

| Rocking curve value (deg) | | | | | |
|---|---|---|---|---|---|
| Li-doped NiO (0, 0, 2) | | Sr(Ti,Nb)O$_3$ (0, 0, 2) | | Pt | |
| Position | FWHM | Position | FWHM | Position | FWHM |
| 21.86 | 0.33 | 22.91 | 0.25 | 23.08 | 0.21 |

The full-width half-maximum of the rocking curve of the Pt(200) reflection was 0.21°, the full-width half-maximum of the rocking curve of the Ni$_{90}$Li$_{10}$O (002) reflection was 0.33°, and the full-width half-maximum of the rocking curve of the SrTi$_{80}$Nb$_{20}$O$_3$ (002) reflection was 0.25°. Accordingly, good orientation property was confirmed.

Figure 5:
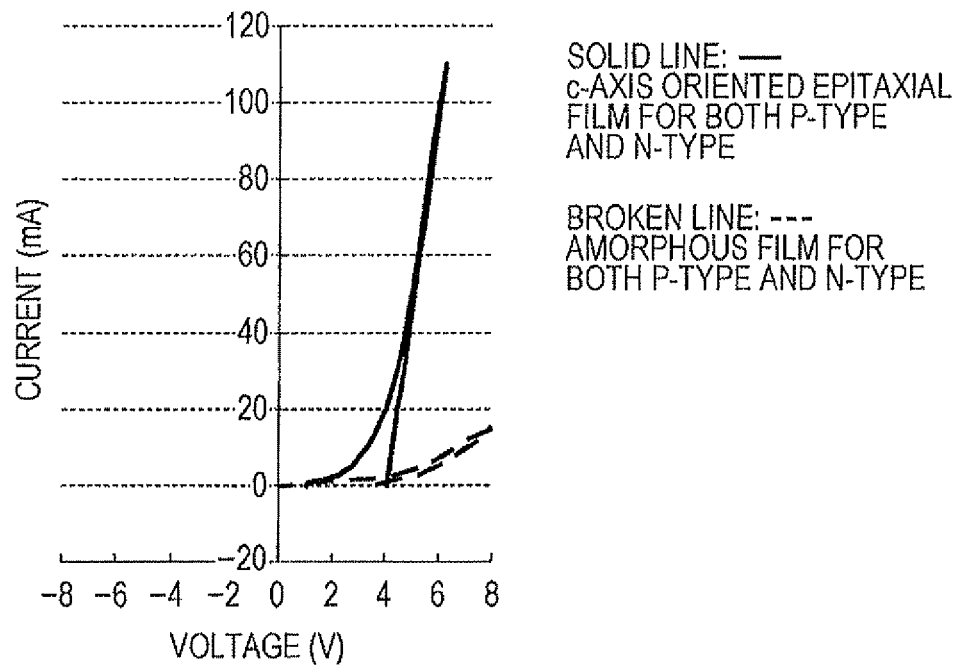
FIG. 5 is a graph showing a current-voltage characteristic of a p-NiO/n-$SrTiO_3$ junction.

A substrate having a layered film formed thereon was subjected to an in-plane measurement by using an x-ray diffractometer shown in FIG. 2 to measure the single crystal orientation of the substrate and the in-plane orientation of each layer. As shown in FIG. 5, it was confirmed that the difference in in-plane orientation angle of the Pt(200) plane, the SrTi$_{80}$Nb$_{20}$O$_3$ (200) plane, and the Ni$_{90}$Li$_{10}$O (200) with respect to the (400) plane of the Si substrate was within 0.0098°. The angle $\theta_\chi$-Φ with respect to the x-ray incident axis in Table 5 was a value obtained by calculating the diffraction angle $\theta_\chi$ from the observed diffraction angle $2\theta_\chi$ and subtracting φ, which is the angle of rotation of the sample stage in-plane angle Φ of the x-ray diffractometer, therefrom.

TABLE 5

| | Angle with respect to x-ray incident axis ($\theta_\chi$ − Φ) | Relative in-plane rotation angle with respect to Si(400) in-plane orientation |
|---|---|---|
| Si(400) | 45.9820 | — |
| Pt(200) | 45.9826 | 0.0006 |
| SrTiO$_3$(200) | 45.9728 | −0.0092 |
| Sr(Tb,Nb)O$_3$(200) | 45.9733 | −0.0087 |
| Li-doped NiO(200) | 45.9730 | −0.0090 |
| Range of angle ($\theta_\chi$ − Φ) of Si to PZT with respect to x-ray incident axis | | 0.0098 |

Figure 4:
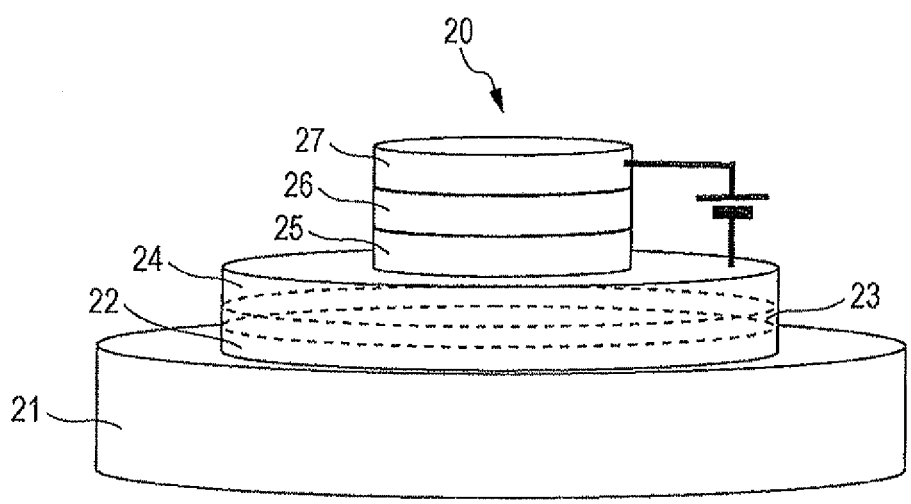
FIG. 4 is a schematic diagram showing a device structure of an N-type semiconductor oxide thin film/P-type semiconductor oxide thin film junction diode according to Examples.
Figure 6:
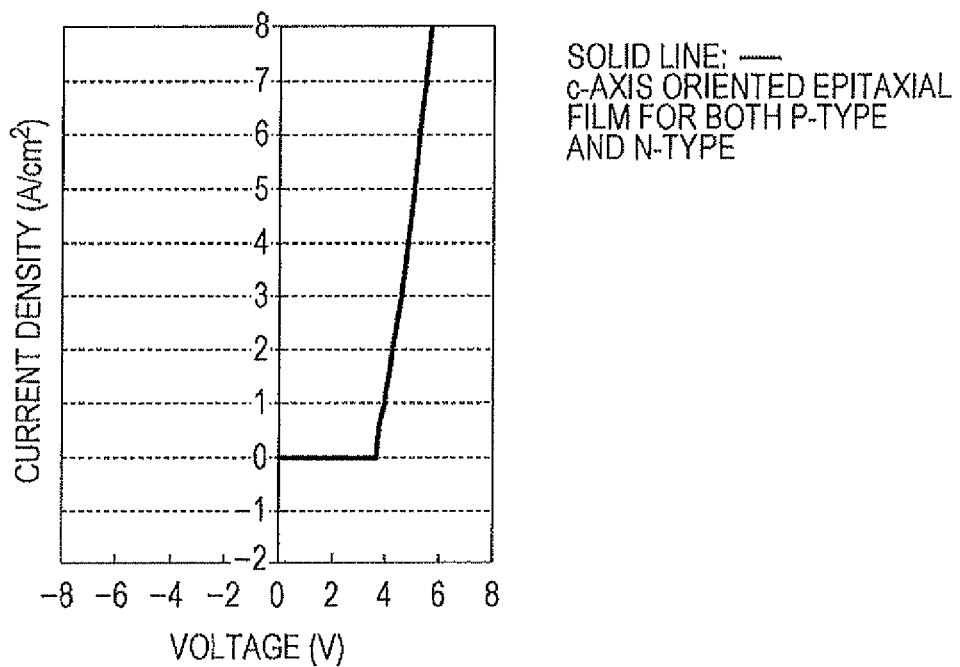
FIG. 6 is a graph showing a current density-voltage characteristic of a p-NiO/n-$SrTiO_3$ junction.
Figure 7:
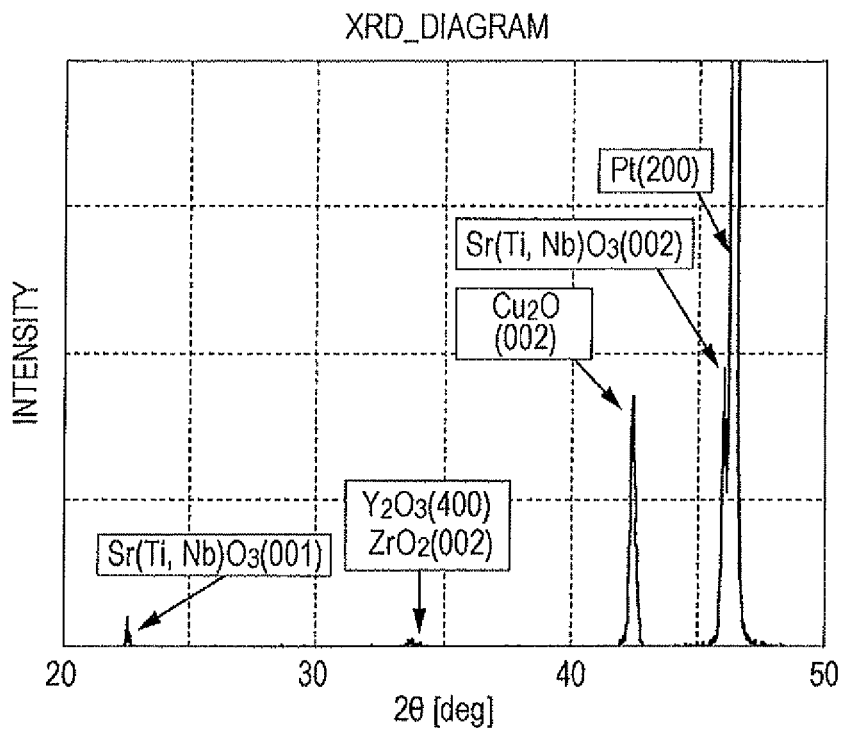
FIG. 7 is a x-ray diffraction chart of a $Cu_2O$/Nb-doped $SrTiO_3$/Pt/$Y_2O_3$/$ZrO_2$/Si(100) layered structure.

A PN junction diode structural element shown in FIG. 4 was made from the obtained layered film through photolithography and dry etching. The PN junction diode structural element is constituted by a single crystal substrate 21, a buffer layer 22, a buffer layer 23, a lower metal thin film 24, an N-type semiconductor oxide thin film 25, a P-type semiconductor oxide thin film 26, and an upper metal thin film 27. The current-voltage characteristic and the current density-voltage characteristic of the structural element are shown in FIG. 5 and FIG. 6, respectively. A rectifying property typical of PN junction diodes was obtained and the threshold voltage under forward bias was about 4 V. This value conforms well with the band gap(about 4.0 V) of NiO. As shown in FIG. 7, the characteristics of an element that includes an amorphous P-type semiconductor oxide thin film and an amorphous N-type semiconductor oxide film were also investigated. The rectifying property was moderate for a diode and the threshold voltage was about 3 V under forward bias and instable each time the measurement was conducted.

Example 2

Cu$_2$O was formed to a thickness of 50 nm on an N-type semiconductor oxide thin film composed of SrTi$_{80}$Nb$_{20}$O$_3$ (001) as in Example 1 so as to form a Cu$_2$O (001)/ SrTi$_{80}$Nb$_{20}$O$_3$ (001)/Pt(001)/Y$_2$O$_3$(100)/ZrO$_2$(001)/Si(100) layered film. The substrate temperature during formation of SrTi$_{80}$Nb$_{20}$O$_3$ and Cu$_2$O was 400 to 900° C. The layered film was subjected to a θ/2θ x-ray diffraction measurement using the x-ray diffractometer shown in FIG. 2. The x-ray diffraction data of the layered film is shown in FIG. 7 and Table 6. X-ray diffraction reveals that SrTi$_{80}$Nb$_{20}$O$_3$ and Cu$_2$O are purely c-axis oriented films.

TABLE 6

| Cu$_2$O data | | | | | Sr(Ti,Nb)O$_3$ data | | | | | Pt data |
|---|---|---|---|---|---|---|---|---|---|---|
| Cu$_2$O (0, 0, 2) | | Cu$_2$O (1, 1, 1) | | Intensity ratio (1, 1, 1)/ (0, 0, 2) % | Sr(Ti,Nb)O$_3$ (0, 0, 2) | | Sr(Ti,Nb)O$_3$ (1, 1, 0) | | Intensity ratio (1, 1, 0)/ (0, 0, 2) % | Pt 2θ (deg) |
| 2θ (deg) | Intensity (counts) | 2θ (deg) | Intensity (counts) | | 2θ (deg) | Intensity (counts) | 2θ (deg) | Intensity (counts) | | |
| 42.44 | 682.9 | 36.44 | 6.7 | 0.98 | 46.06 | 756.40 | 32.22 | 4.4 | 0.58 | 46.40 |

TABLE 6-continued

| Rocking curve value (deg) | | | | | |
|---|---|---|---|---|---|
| $Cu_2O$ (0, 0, 2) | | $Sr(Ti,Nb)O_3$ (0, 0, 2) | | Pt | |
| Position | FWHM | Position | FWHM | Position | FWHM |
| 21.22 | 0.44 | 22.92 | 0.28 | 23.08 | 0.22 |

Table 6 shows that the full-width half-maximum (FWHM) of the rocking curve of Pt(200) reflection is 0.22°, and FWHMs of the rocking curves of $SrTi_{80}Nb_{20}O_3$(002) reflection and $Cu_2O$(002) reflection are 0.44° and 0.28°, respectively. The results confirmed a good orientation property. In Table 6, the main peak of the heterogeneous PN junction epitaxial oxide film was assumed to be the (002) peak of the c-axis oriented surface which exhibits the maximum peak intensity. The plane that exhibits the maximum peak intensity other than that of the (002) peak was assumed to be the (111) plane for the P-type semiconductor oxide thin film $Cu_2O$. The plane that exhibits the maximum peak intensity other than that of the (002) peak was assumed to be the (110) plane for the N--type semiconductor oxide thin film $SrTi_{80}Nb_{20}O_3$. Then the peak intensity ratio (111)/(002) was calculated for the P-type semiconductor oxide thin film and the peak intensity ratio (110)/(002) ratio was calculated for the N-type semiconductor oxide thin film. As shown in Table 6, the ratio was 0.98% for the P-type semiconductor oxide film $Cu_2O$ and 0.58% for the N-type semiconductor oxide thin film $SrTi_{80}Nb_{20}O_3$.

The substrate with layers thereon was subjected to an in-plane measurement with an x-ray diffractometer shown in FIG. 2 to measure the rotation angles of the in-plane component of the single crystal orientation of the substrate and the in-plane component of the crystal orientation of each layer. The results confirmed that the difference in rotation angle between the (400) plane, namely, the in-plane component of the crystal orientation of the Si substrate, and each of the Pt(200) plane, the $SrTi_{80}Nb_{20}O_3$(200) plane and the $Cu_2O$ (200) plane is 0.028°.

Figure 8:
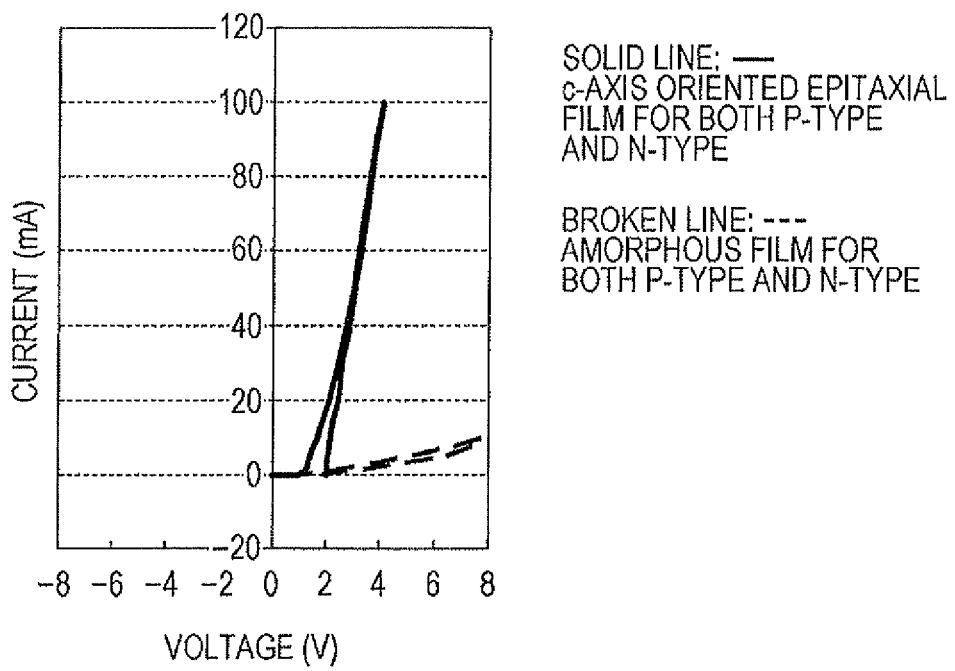
FIG. 8 is a graph showing a current-voltage characteristic of a p-$Cu_2O$/n-$SrTiO_3$ junction.
Figure 9:
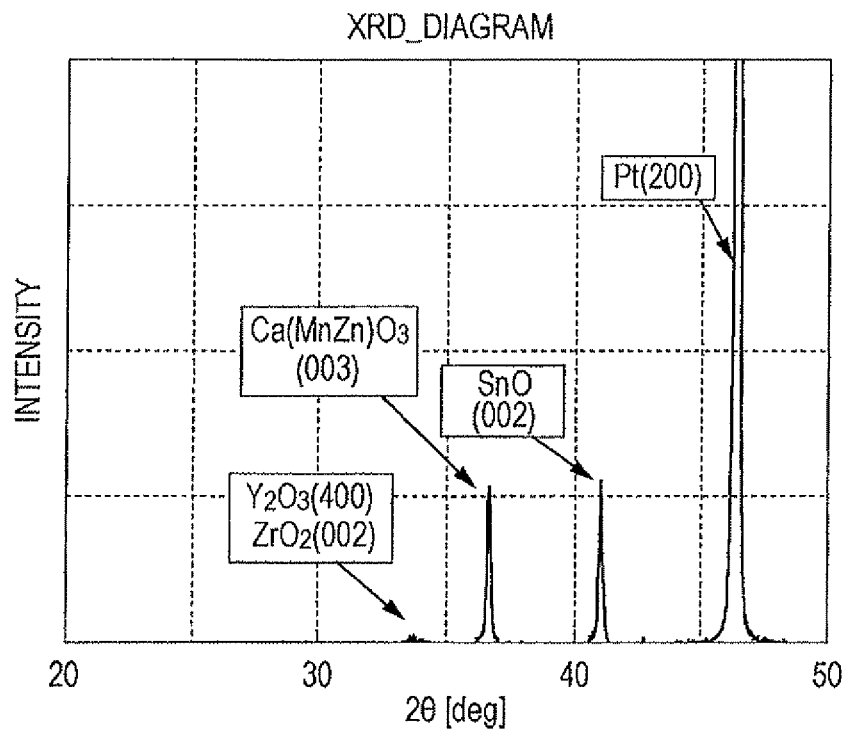
FIG. 9 is an x-ray diffraction chart of a SnO/Zn-doped $CaMnO_3$/Pt/$Y_2O_3$/$ZrO_2$/Si(100) layered structure.

A PN junction diode structural element shown in FIG. 4 was made from the obtained layered film through photolithography and dry etching. The current-voltage characteristic of the structural element is shown in FIG. 8. A rectifying property typical of PN junction diodes was obtained and the threshold voltage under forward bias was about 2 V. This value conforms well with the band gap (about 2.0 V) of $Cu_2O$. As shown in FIG. 9, the characteristic of an element that includes an amorphous P-type semiconductor oxide thin film and an amorphous N-type semiconductor oxide film was also investigated. The rectifying property was moderate for a diode and the threshold voltage under forward bias varied in the range of 1 V to 2 V and was instable each time the measurement was conducted.

Example 3

An N-type oxide film semiconductor $CaMn_{95}Zn_5O_3$ was formed to a thickness of 50 nm on the Pt(001) metal thin film of Example 1 and then SnO (001) was formed thereon to a thickness of 50 nm so as to obtain a SnO (001)/$CaMn_{95}Zn_5O_3$ (001)/Pt(001)/$Y_2O_3$(100)/$ZrO_2$(001)/Si(100) layered film. The substrate temperature during formation of $CaMn_{95}Zn_5O_3$ and SnO was 400 to 900° C. The layered film was subjected to a θ/2θ x-ray diffraction measurement using the x-ray diffractometer shown in FIG. 2. The x-ray diffraction data of the layered film is shown in FIG. 9 and Table 7. X-ray diffraction reveals that the $CaMn_{95}Zn_5O_3$ and SnO thin films are purely c-axis oriented films.

TABLE 7

| SnO data | | | | | $Ca(Mn,Zn)O_3$ data | | | | | Pt data Pt |
|---|---|---|---|---|---|---|---|---|---|---|
| SnO (0, 0, 2) | | SnO (1, 1, 0) | | Intensity ratio (1, 1, 0)/ (0, 0, 2) % | $Ca(Mn,Zn)O_3$ (0, 0, 2) | | $Ca(Mn,Zn)O_3$ (1, 1, 0) | | Intensity ratio (1, 1, 0)/ (0, 0, 2) % | |
| 2θ (deg) | Intensity (counts) | 2θ (deg) | Intensity (counts) | | 2θ (deg) | Intensity (counts) | 2θ (deg) | Intensity (counts) | | 2θ (deg) |
| 41.01 | 444.3 | 33.33 | 4.3 | 0.97 | 42.02 | 562.40 | 31.27 | 4.8 | 0.85 | 46.38 |

| Rocking curve value (deg) | | | | | |
|---|---|---|---|---|---|
| SnO (0, 0, 2) | | $Ca(Mn,Zn)O_3$ (0, 0, 2) | | Pt | |
| Position | FWHM | Position | FWHM | Position | FWHM |
| 20.51 | 0.58 | 21.01 | 0.55 | 23.09 | 0.29 |

Table 7 shows that the FWHM of the rocking curve of Pt(200) reflection is 0.29°, and the FWHMS of the rocking curves of $CaMn_{95}Zn_5O_3$(002) reflection and SnO(002) reflection are 0.55° and 0.58°, respectively, indicating good orientation property.

The substrate with layers thereon was subjected to an in-plane measurement with an x-ray diffractometer shown in FIG. 2 to measure the rotation angles of the in-plane component of the single crystal orientation of the substrate and the in-plane component of the crystal orientation of each layer. The results confirmed that the difference in rotation angle between the (400) plane, namely, the in-plane component of the crystal orientation of the Si substrate, and each of the Pt(200) plane, the $CaMn_{95}Zn_5O_3(200)$ plane and the SnO (200) plane is 0.092°.

Figure 10:
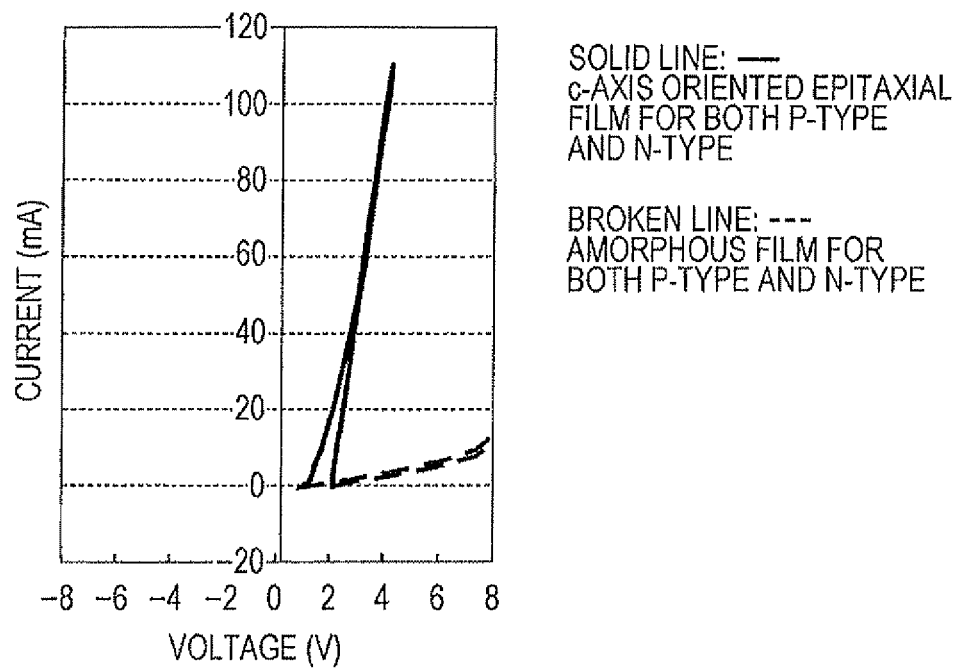
FIG. 10 is a graph showing a current-voltage characteristic of a p-SnO/n-$CaMnO_3$ junction.

A PN junction diode structural element shown in FIG. 4 was made from the obtained layered film through photolithography and dry etching. The current-voltage characteristic of the structural element is shown in FIG. 10. A rectifying property typical of PN junction diodes was obtained and the threshold voltage under forward bias was about 2.1 V. This value conforms well with the band gap (about 2.2 V) of $Cu_2O$. As shown in FIG. 10, the characteristic of an element that includes an amorphous P-type semiconductor oxide thin film and an amorphous N-type semiconductor oxide film was also investigated. The rectifying property was moderate for a diode and the threshold voltage under forward bias varied in the range of 1 V to 2 V and was instable each time the measurement was conducted.

Example 4

As in Examples 1 and 3, a $ZrO_2$ thin film, an $Y_2O_3$ thin film, a Pt thin film, and an N-type oxide film semiconductor, which was either $SrTi_{80}Nb_{20}O_3$ or $CaMn_{95}Zn_5O_3$, were grown to form a layered film on a Si(100) single crystal substrate. An adhesive resin film was formed on the layered film on the Si single crystal substrate by spin-coating.

Figure 11:
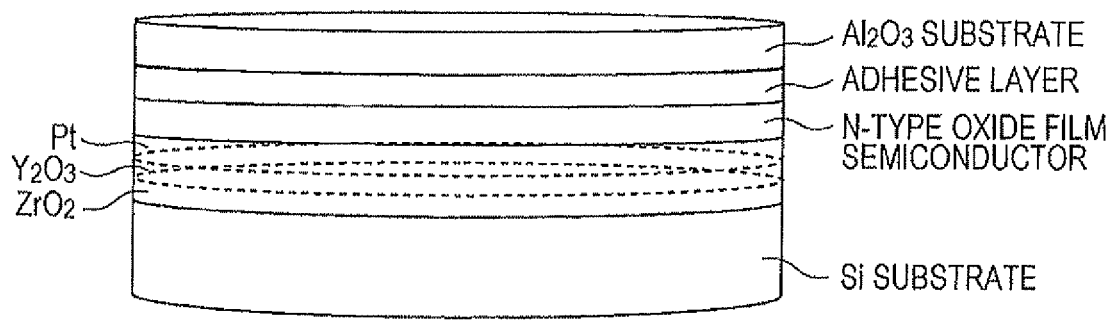
FIG. 11 is a schematic diagram of a laminate bonded to an alumina substrate for evaluating an N-type oxide film semiconductor.

An $Al_2O_3$ substrate having the same size as the Si single crystal substrate was superimposed on the layered film so as to face the N-type oxide film semiconductor on the Si single crystal substrate and bonded thereto under pressure by a thermal curing technique. As a result, a laminate shown in FIG. 11 was obtained. The adhesive film may be formed by using a cold-setting adhesive or a hot-melt adhesive instead of by the thermal curing technique. When the adhesive film is composed of a ultraviolet (UV)-curable epoxy resin, bonding is preferably performed by irradiation with ultraviolet rays. When alignment is needed in the process, a UV/thermal cure adhesive is preferably used.

The laminate was flipped so that the $Al_2O_3$ substrate was at the bottom and the Si single crystal substrate at the top was removed by reactive ion etching (RIE). Alternatively, the Si single crystal substrate may be removed by wet etching with fluonitric acid, by polishing that uses stone grinding (vertical) or colloidal silica (CMP) for rough grinding, or by polishing with diamond slurry using a soft-metal surface plate (such as tin surface plate). Then buffer film constituted by the $ZrO_2$ thin film and the $Y_2O_3$ thin film was etched by RIE. As a result, a laminate that includes the $Al_2O_3$ substrate at the bottom, the adhesive layer and the N-type oxide film semiconductor at the middle, and the Pt thin film electrode layer at the top was obtained.

Next, a resist was photolithographically formed on the Pt thin film electrode layer so that, for every 4 mm×20 mm rectangular area on a 3-inch $Al_2O_3$ substrate, 1-mm circular patterns for measuring thermoelectric characteristics are formed in a symmetrical manner with respect to the center of the rectangular area with a distance of 4 mm and 8 mm from the center.

Through the resist pattern used as a mask, the regions not covered with the mask were etched by RIE until the N-type oxide film semiconductor layer was exposed. The resist pattern was then removed and a group of 1-mm Pt circular electrodes was formed.

Figure 13:
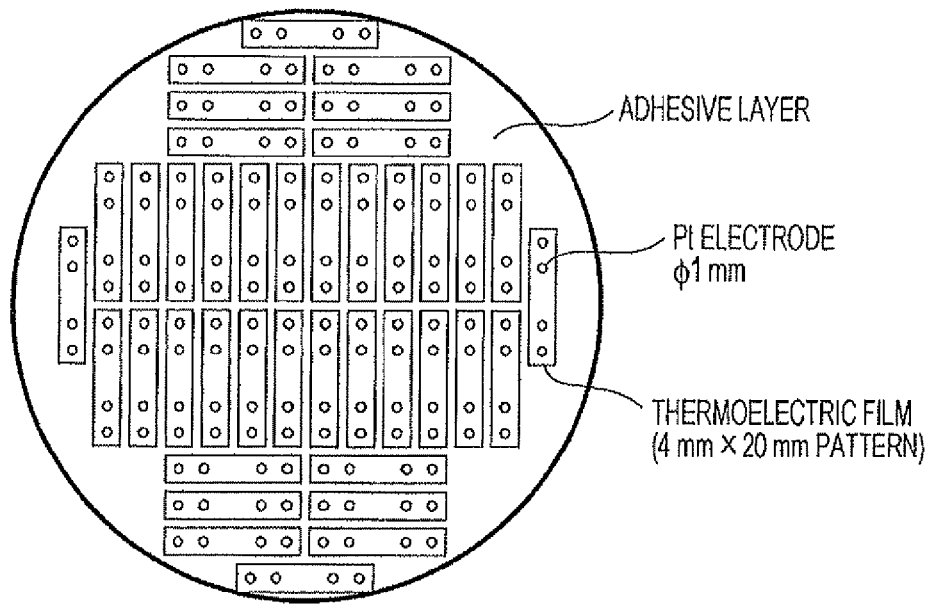
FIG. 13 is a plan view showing an evaluation pattern on an alumina substrate for Seebeck measurement.

Next, the N-type oxide film semiconductor on the laminate was patterned into a 4 mm×20 mm pattern. In this step also, a 4 mm×20 mm resist pattern was formed by photolithography and etching. Then through this resist pattern used as a mask, the regions not covered with the mask were etched by RIE until the adhesive layer was exposed. The resist pattern was then removed and the N-type oxide film semiconductor layer was processed into electrically isolated individual pieces each having a 4 mm×20 mm planar shape so as to form a laminate shown in FIG. 13.

Figure 14:
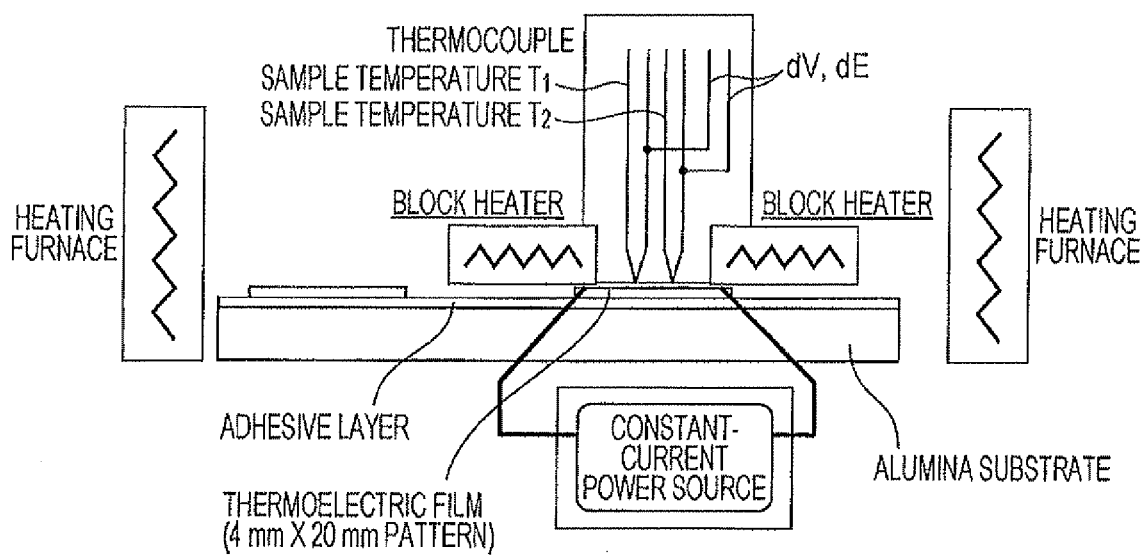
FIG. 14 is a schematic diagram illustrating a Seebeck measurement instrument.

Next, the Seebeck coefficient of each 4 mm×20 mm piece of the N-type oxide film semiconductor layer on the $Al_2O_3$ substrate was measured. As shown in FIG. 14, the $Al_2O_3$ substrate was placed in a heating furnace and held at a predetermined temperature of 50° C. Two block heaters were respectively set to the Pt electrodes formed at long-side two ends of the 4 mm×20 mm piece and grounded to the rectangular-area-end Pt electrodes. One of the block heaters was operated to produce a temperature gradient in the rectangular sample. The Seebeck coefficient was determined by measuring the thermoelectromotive force dE between the same wire on one side of the thermocouple pressed against the 1-mm electrodes formed on the sample surface. The electrical resistance was measured by a DC four-terminal method in which a constant current I was applied to both ends of the sample to measure the voltage drop dV between the same wire of the thermocouple and the thermoelectromotive force between the lead lines was subtracted.

The data obtained from measurement is shown in Table 8. The data shows that $SrTi_{80}Nb_{20}O_3$ and $CaMn_{95}Zn_5O_3$ have good thermoelectric characteristics as the N-type oxide film semiconductor.

TABLE 8

| Thermoelectric material | Seebeck coefficient (absolute value) μV/K |
|---|---|
| $SrTi_{80}Nb_{20}O_3$ | 880 |
| $CaMn_{95}Zn_5O_3$ | 400 |
| $Ni_{90}Li_{10}O$ | 250 |
| $Cu_2O$ | 720 |
| SnO | 210 |

Example 5

As in Examples 1 and 3, a $ZrO_2$ thin film, a $Y_2O_3$ thin film, a Pt thin film, an N-type oxide film semiconductor, a P-type semiconductor which was either $Ni_{90}Li_{10}O$ or $Cu_2O$ or SnO, were grown to form a layered film on a Si(100) single crystal substrate. An adhesive resin film was formed on the layered film on the Si single crystal substrate by spin-coating.

Figure 12:
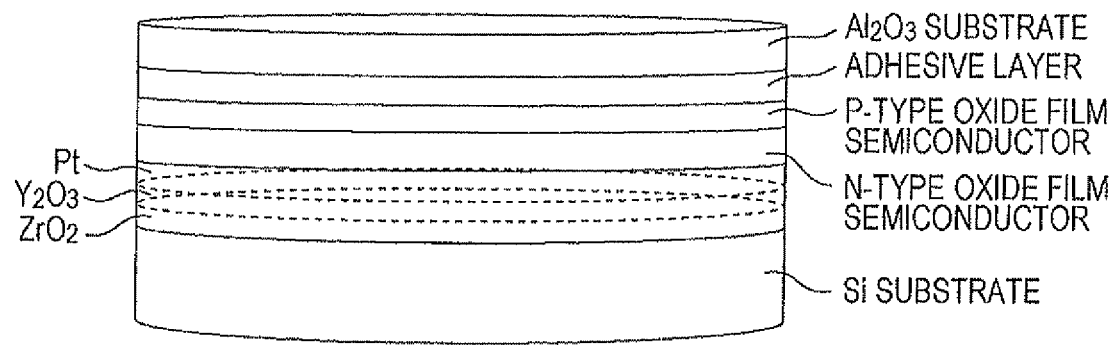
FIG. 12 is a schematic diagram of a laminate bonded to an alumina substrate for evaluating an P-type oxide film semiconductor.

Then, as in Example 4, an $Al_2O_3$ substrate having the same size as the Si single crystal substrate was superimposed on the layered film so as to face the P-type oxide film semiconductor on the Si single crystal substrate and bonded thereto under pressure by a thermal curing technique so as to form a laminate shown in FIG. 12.

Next, the laminate was flipped so that the $Al_2O_3$ substrate was at the bottom and the Si single crystal substrate at the top was removed by RIE. The buffer film constituted by the $ZrO_2$ thin film and the $Y_2O_3$, the Pt thin film, and the N-type oxide film semiconductor were etched. As a result, a laminate that includes the $Al_2O_3$ substrate at the bottom, the adhesive layer at the middle, and the P-type oxide film semiconductor layer at the top was obtained.

Then Pt was vapor-deposited on the P-type oxide film semiconductor to a thickness of 500 Å to 1000 Å.

Then, a resist is photographically formed on the Pt thin film electrode layer so that, for every 4 mm×20 mm rectangular area on a 3-inch Al$_2$O$_3$ substrate, 1-mm circular patterns for measuring thermoelectric characteristics are formed in a symmetrical manner with respect to the center of the rectangular area with a distance of 4 mm and 8 mm from the center.

Through the resist pattern used as a mask, the regions not covered with the mask were etched by RIE until the P-type oxide film semiconductor layer was exposed. The resist pattern was then removed and a group of 1-mm Pt circular electrodes was formed.

Next, the P-type oxide film semiconductor on the laminate was patterned into a 4 mm×20 mm pattern. In this step also, a 4 mm×20 mm resist pattern was formed by photolithography and etching. Then through this resist pattern used as a mask, the regions not covered with the mask were etched by RIE until the adhesive layer was exposed. The resist pattern was then removed and the P-type oxide film semiconductor layer was processed into electrically isolated individual pieces each having a 4 mm×20 mm planar shape so as to form a laminate shown in FIG. 13.

Next, the Seebeck coefficient of each 4 mm×20 mm piece of the P-type oxide film semiconductor layer on the Al$_2$O$_3$ substrate was measured. As shown in FIG. 14, the Al$_2$O$_3$ substrate was placed in a heating furnace and held at a predetermined temperature of 50° C. Two block heaters were respectively set to the Pt electrodes formed at long-side two ends of the 4 mm×20 mm piece and grounded to the rectangular-area-end Pt electrodes. One of the block heaters was operated to produce a temperature gradient in the rectangular sample. The Seebeck coefficient was determined by measuring the thermoelectromotive force dE between the same wire on one side of the thermocouple pressed against the 1-mm electrodes formed on the sample surface. The electrical resistance was measured by a DC four-terminal method in which a constant current I was applied to both ends of the sample to measure the voltage drop dV between the same wire of the thermocouple and the thermoelectromotive force between the lead lines was subtracted.

The data obtained from measurement is shown in Table 8. The data shows that Ni$_{90}$Li$_{10}$O, Cu$_2$O, and SnO have good thermoelectric characteristics as the P-type oxide film semiconductor.

What is claimed is:

1. A layered film formed on a single crystal substrate, comprising:
    a heteroepitaxial PN junction oxide thin film including an N-type semiconductor oxide thin film and a P-type semiconductor oxide thin film that are each epitaxially grown to have c-axis orientation represented by (00k);
    an epitaxially grown buffer layer containing a first buffer sublayer and a second buffer sublayer and serving as an underlayer for the heteroepitaxial PN junction oxide thin film; and
    an epitaxially grown metal thin film disposed between the heteroepitaxial PN junction oxide thin film and the buffer layer, the metal thin film containing at least one element selected from the group consisting of Pt, Ir, Pd, Ru, and Rh;
    wherein:
    the first buffer sublayer consists essentially of a ZrO$_2$ film;
    the second buffer sublayer consists essentially of a Y$_2$O$_3$ film; and
    the N-type semiconductor oxide thin film is composed of a doped perovskite-type compound represented by R(Mx,Dy)O$_3$ or (Rx,Dy)MO$_3$ obtained by doping a perovskite-type compound represented by general formula RMO$_3$ with a metal D other than R and M, and the amount of the metal D is adjusted to x+y=1 and 0.03≤y≤0.3 to control epitaxial growth of the P-type semiconductor oxide thin film on the N-type semiconductor oxide thin film so that the P-type semiconductor oxide thin film has c-axis orientation represented by (00k).

2. The layered film according to claim 1, wherein, in the doped perovskite-type compound represented by R(Mx,Dy)O$_3$ or (Rx,Dy)MO$_3$, R is selected from the group consisting of Ba, Ca, Fe, K, La, Li, Mg, Mn, Na, Sr, and Zn, M is selected from the group consisting of Co, Fe, Hf, La, Mn, Nb, Ni, Si, Sn, Ta, Ti, and Zr, and D is selected from the group consisting of Al, Ba, Ca, Ce, Co, Cr, Fe, Hf, K, La, Mg, Mn, Na, Nb, Ni, Sn, Sr, V, Y, Zn, and Zr.

3. The layered film according to claim 1, wherein the P-type semiconductor oxide thin film is composed of a material selected from the group consisting of SnO, NiO, and Cu$_2$O.

4. The layered film according to claim 1, wherein, when an oriented surface of a stack constituted by the N-type semiconductor oxide thin film and the P-type semiconductor oxide thin film is subjected to x-ray diffraction, the highest intensity of a reflection peak of a plane other than a c-axis-oriented plane represented by (00k) is 10% or less of the intensity of a reflection peak of the c-axis-oriented plane.

5. The layered film according to claim 1, wherein, when the N-type semiconductor oxide thin film and the P-type semiconductor oxide thin film are analyzed by x-ray diffraction through rocking curve scan of a c-axis-oriented plane represented by (00k), at least one of the N-type semiconductor oxide thin film and the P-type semiconductor oxide thin film exhibits a full-width half-maximum of 0.8° or less.

6. The layered film according to claim 1, wherein the differences in rotation angle between the in-plane surface orientation of the single crystal substrate and the in-plane surface orientation of the N-type semiconductor oxide thin film and between the in-plane surface orientation of the single crystal substrate and the in-plane surface orientation of the P-type semiconductor oxide thin film are 1° or less.

7. The layered thin film according to claim 1, wherein the single crystal substrate is composed of a material selected from the group consisting of Si, MgO, SrTiO$_3$, and LiNbO$_3$.

8. The layered film according to claim 1, wherein the second buffer sublayer is formed on top of the first buffer sublayer.

9. A layered film formed on a single crystal substrate, comprising:
    a heteroepitaxial PN junction oxide thin film including an N-type semiconductor oxide thin film and a P-type semiconductor oxide thin film that are each epitaxially grown to have c-axis orientation represented by (00k);
    an epitaxially grown buffer layer containing a first buffer sublayer and a second buffer sublayer and serving as an underlayer for the heteroepitaxial PN junction oxide thin film; and
    an epitaxially grown metal thin film disposed between the heteroepitaxial PN junction oxide thin film and the buffer layer, the metal thin film containing at least one element selected from the group consisting of Pt, Ir, Pd, Ru, and Rh;
    wherein:
    the first buffer sublayer comprises a ZrO$_2$ film;
    the second buffer sublayer comprises a Y$_2$O$_3$ film; and
    the N-type semiconductor oxide thin film is composed of a doped perovskite-type compound represented by R(Mx, Dy)O$_3$ or (Rx,Dy)MO$_3$ obtained by doping a perovskite-type compound represented by general formula $RMO_3$ with a metal D other than R and M, and the amount of the metal D is adjusted to $x+y=1$ and $0.03 \leq y \leq 0.3$ to control epitaxial growth of the P-type semiconductor oxide thin film on the N-type semiconductor oxide thin film so that the P-type semiconductor oxide thin film has c-axis orientation represented by (00k).

* * * * *